(12) United States Patent (10) Patent No.: US 9,287,317 B2
Cha et al. (45) Date of Patent: Mar. 15, 2016

(54) IMAGE SENSOR MODULE AND METHOD OF MANUFACTURING THE SAME

(71) Applicant: SAMSUNG ELECTRO-MECHANICS CO., LTD., Suwon, Gyunggi-do (KR)

(72) Inventors: Ji Bum Cha, Gyunggi-do (KR); Sung Jae Lee, Gyunggi-do (KR); In Cheol Chang, Gyunggi-do (KR); Sung Jun Byun, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 12 days.

(21) Appl. No.: 14/154,758

(22) Filed: Jan. 14, 2014

(65) Prior Publication Data

US 2014/0210027 A1 Jul. 31, 2014

Related U.S. Application Data

(60) Provisional application No. 61/756,802, filed on Jan. 25, 2013.

(30) Foreign Application Priority Data

Dec. 11, 2013 (KR) ........................ 10-2013-0154119

(51) Int. Cl.
*H01L 27/146* (2006.01)
*H01L 23/00* (2006.01)
*H04N 5/225* (2006.01)

(52) U.S. Cl.
CPC .......... *H01L 27/14685* (2013.01); *H01L 24/83* (2013.01); *H01L 27/14618* (2013.01); *H01L 27/14625* (2013.01); *H01L 27/14683* (2013.01); *H04N 5/2257* (2013.01); *H01L 2224/83192* (2013.01); *H01L 2224/83856* (2013.01); *H01L 2924/3511* (2013.01)

(58) Field of Classification Search
CPC ....................................................... H01L 24/26
USPC ........................................................ 438/118
See application file for complete search history.

(56) References Cited

U.S. PATENT DOCUMENTS 8,546,932 B1 * 10/2013 Chung .......................... 257/686
2008/0043127 A1 * 2/2008 Mochizuki et al. ........... 348/294

(Continued)

FOREIGN PATENT DOCUMENTS

JP 3561209 B2 9/2004
JP 2006-303481 A 11/2006
JP 2006-303482 A 11/2006

OTHER PUBLICATIONS

Notice of Office Action Korean Patent Application No. 10-2013-0154119 dated Jan. 19, 2015 with full English translation.

*Primary Examiner* — Mohammad Choudhry
(74) *Attorney, Agent, or Firm* — NSIP Law

(57) ABSTRACT

There is provided an image sensor module, including: an image sensor having a small thickness of 175 μm or less and having a first coefficient of thermal expansion; a substrate having the image sensor mounted thereon and having a second coefficient of thermal expansion higher than the first coefficient of thermal expansion; and an adhesive layer disposed between the image sensor and the substrate and including an adhesive having a third coefficient of thermal expansion of 130 ppm/° C. or more at a glass transition temperature Tg or more.

4 Claims, 7 Drawing Sheets

(56) References Cited

U.S. PATENT DOCUMENTS

| | | |
|---|---|---|
| 2009/0046183 A1 | 2/2009 | Nishida et al. |
| 2009/0053850 A1 | 2/2009 | Nishida et al. |
| 2011/0057284 A1* | 3/2011 | Brodie ............................ 257/459 |
| 2012/0043635 A1* | 2/2012 | Yang .............................. 257/432 |
| 2014/0048957 A1* | 2/2014 | Chung ........................... 257/777 |

* cited by examiner

IMAGE SENSOR MODULE AND METHOD OF MANUFACTURING THE SAME

CROSS-REFERENCE TO RELATED APPLICATION

This application claims the benefits of U.S. Provisional application No. 61/756,802 filed on Jan. 25, 2013, with the USPTO and Korean Patent Application No. 10-2013-0154119 filed on Dec. 11, 2013, with the Korean Intellectual Property Office, the disclosures of which are incorporated herein by reference.

BACKGROUND

The present disclosure relates to an image sensor module capable of alleviating a warpage phenomenon in an image sensor, and a method of manufacturing the same.

As a subminiature camera module such as a mobile communications terminal is improved in terms of the resolution thereof, an image sensor has a reduced pixel size. Here, a degree of warpage of the image sensor may significantly influence resolution.

In addition, in accordance with demand for subminiature camera module miniaturization, a bare image sensor has recently been required to have a greatly reduced thickness. It may be seen that a warpage phenomenon is caused in the image sensor by curing of a bond during a process of attaching the image sensor having the reduced thickness to a substrate.

In the case in which a warpage phenomenon is caused in the image sensor, optical performance of a lens may be deteriorated.

RELATED ART DOCUMENT (Patent Document 1) Japanese Patent Laid-Open Publication No. 2006-303481
(Patent Document 2) Japanese Patent Laid-Open Publication No. 2006-303482

SUMMARY

An aspect of the present disclosure may provide an image sensor module in which a warpage phenomenon occurring when an image sensor having a reduced thickness is attached to a substrate is decreased, and a method of manufacturing the same.

According to an aspect of the present disclosure, an image sensor module may include: an image sensor having a small thickness of 175 μm or less and having a first coefficient of thermal expansion; a substrate having the image sensor mounted thereon and having a second coefficient of thermal expansion higher than the first coefficient of thermal expansion; and an adhesive layer disposed between the image sensor and the substrate and including an adhesive having a third coefficient of thermal expansion of 130 ppm/° C. or more at a glass transition temperature Tg or more.

The adhesive may include a curable adhesive, and the glass transition temperature of the adhesive may be lower than a curing temperature of the adhesive.

The adhesive may have a thickness less than that of the image sensor.

The substrate may include a copper clad laminate (CCL).

The adhesive may be an epoxy-based adhesive.

According to an aspect of the present disclosure, a method of manufacturing an image sensor module may include: dispensing an adhesive having a third coefficient of thermal expansion of 130 ppm/° C. or more at a glass transition temperature Tg or more to a substrate having a second coefficient of thermal expansion and a thickness of 175 μm or less; temporarily curing and attaching an image sensor having a first coefficient of thermal expansion to the substrate to which the adhesive has been dispensed; and curing the adhesive at the glass transition temperature Tg or more of the adhesive.

Pressure may be applied for 1 to 2 seconds at a temperature range of 120° C. to 160° C. in the attaching of the image sensor to the substrate.

The curing of the adhesive may be performed for about 120 seconds at about 120° C.

The adhesive may be applied to form an adhesive layer thinner than the image sensor.

The substrate may include a copper clad laminate (CCL).
The adhesive may be an epoxy-based adhesive.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
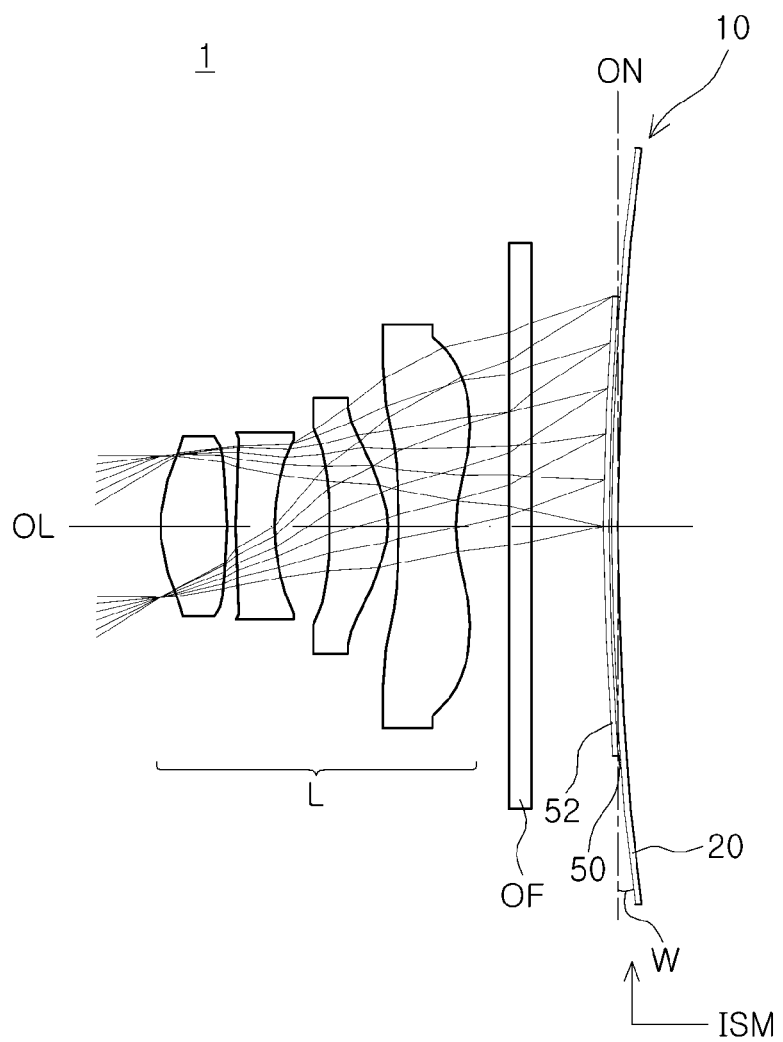
FIG. 1 is a schematic view illustrating that an image is captured by an image sensor module according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Image Sensor Module

FIG. 1 is a schematic view illustrating that an image is captured by an image sensor module according to an exemplary embodiment of the present disclosure.

In an image sensor 50 used in a subminiature camera module 1, when a surface 52 serving to receive an image deviates from a plane ON perpendicular to an optical axis OL, optical performance of a lens L is deteriorated. As the camera module 1 is increased in resolution, the image sensor 50 needs to have a reduced pixel size. When very small degree of deformation occurs in the image sensor 50, a resolution of the lens L is decreased.

The surface 52, serving to receive the image of the image sensor 50, as shown in FIG. 1, deviates from the plane ON perpendicular to the optical axis OL by a very small amount. In the case in which warpage W is generated at an edge portion of the surface 52 receiving the image, a phenomenon in which the image sensor 50 is out of focus due to the warpage generated at the edge portion may occur. The resolution of the lens L may be decreased by as much as the deviation of the surface 52 serving to receive the image of the image sensor 50 from the plane ON perpendicular to the optical axis OL. Here, the image sensor module ISM of FIG. 1 is an assembly of the image sensor 50 and a substrate 20. During a process of manufacturing the image sensor module ISM, the warpage W may be generated. The generation of the warpage W may cause the resolution of the lens L to be further decreased.

FIG. 1 illustrates that the lens L of four sheets is included in the subminiature camera module 1 used for a mobile communications terminal, wherein an optical filter OF for blocking infrared light may be provided between a lens positioned at the last end in an optical axis direction and the image sensor 50.

The number of lenses L may be three to six, depending on required optical performance, and the optical filter OF may be selectively provided as an infrared filter or a cover glass coated with the infrared filter.

Figure 2:
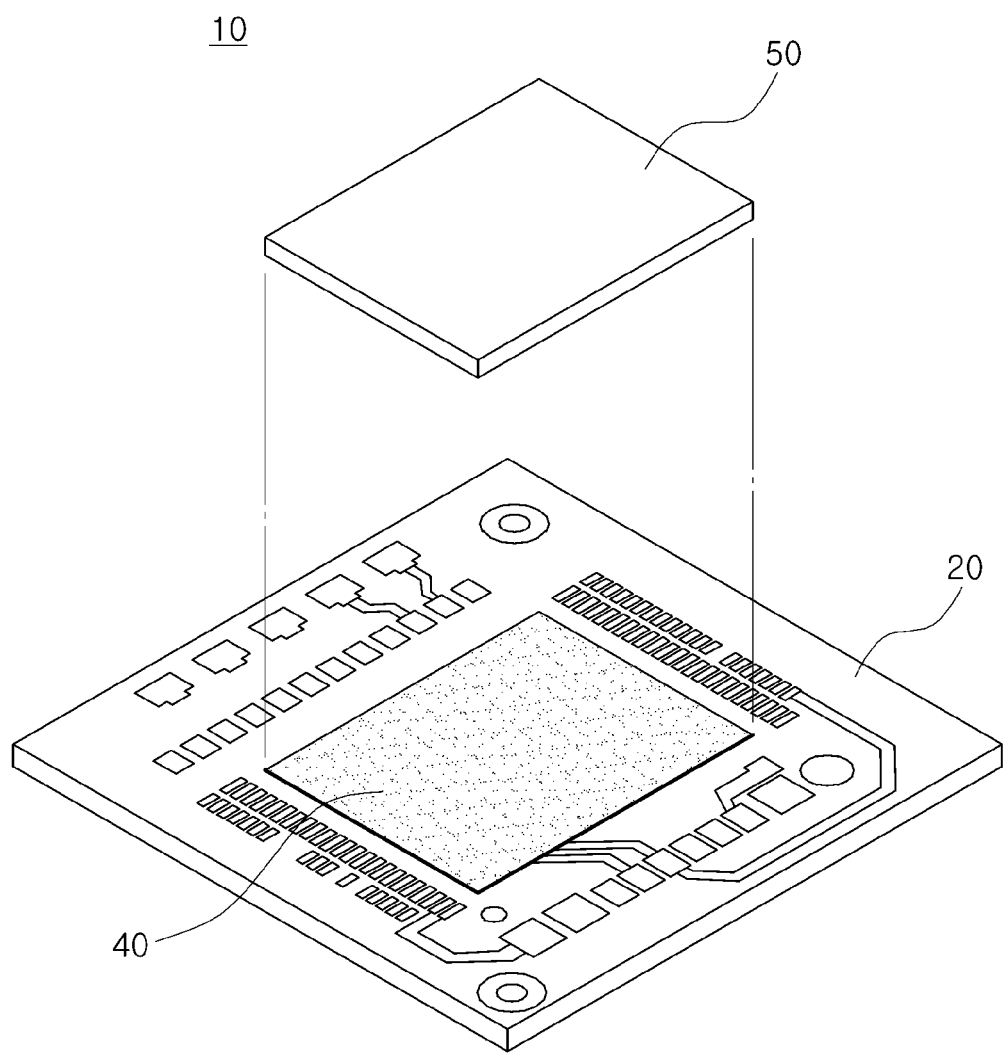
FIG. 2 is a schematic exploded perspective view illustrating an image sensor module according to an exemplary embodiment of the present disclosure.

FIG. 2 is a schematic exploded perspective view illustrating an image sensor module according to an exemplary embodiment of the present disclosure.

Referring to FIG. 2, the image sensor module 10 according to the exemplary embodiment of the present disclosure may include the image sensor 50, the substrate 20, and an adhesive layer 40.

The image sensor 50 may have a small thickness of 175 μm or less.

Here, in the case in which the thickness of the bare image sensor 50 is reduced to be 175 μm or less, warpage deformation may be significantly generated due to adhesive curing. In order to prevent warpage deformation of the thin image sensor 50, it may be important to select an adhesive.

A rear surface of the image sensor 50 having the thickness of 175 μm or less may be ground and be attached to the substrate 20 to which the adhesive is applied. When the adhesive is cured, it may be seen that warpage deformation is generated.

Figure 3:
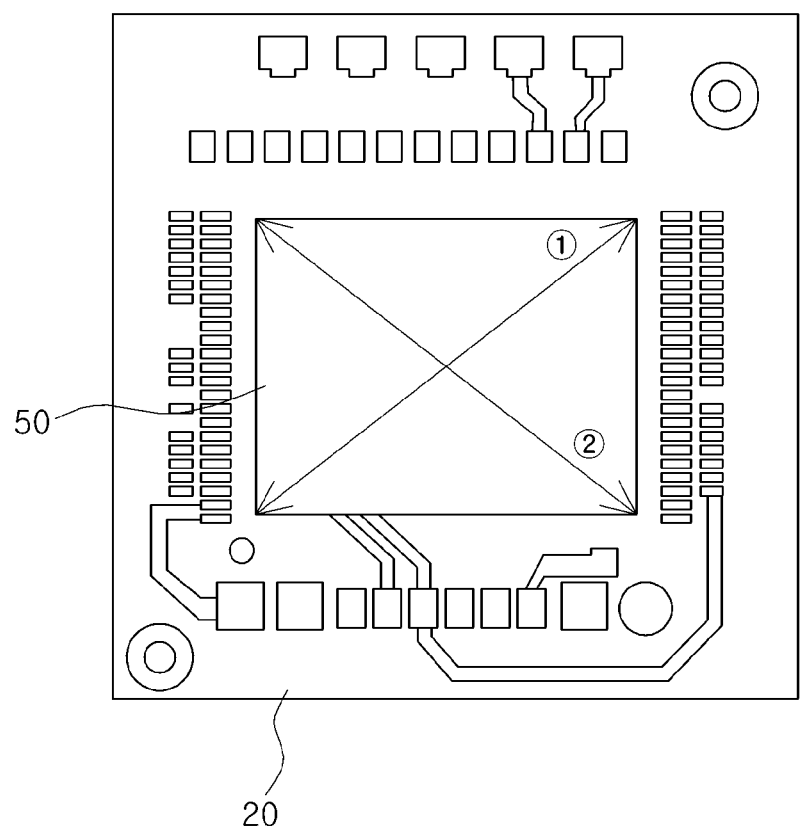
FIG. 3 is a schematic plan view of FIG. 2 illustrating a method of measuring a warpage deformation of an image sensor.

FIG. 3 is a schematic plan view of FIG. 2 illustrating a method of measuring a warpage deformation of an image sensor.

Referring to FIG. 3, a method of measuring warpage deformation of the image sensor 50 may be understood.

The rear surface of the image sensor 50 having the thickness of 175 μm or less may be ground and be attached to the substrate 20 to which the adhesive is applied. After curing the adhesive, warpage deformation is measured in diagonal directions (directions ① and ②) as illustrated in FIG. 3.

A curing condition of the adhesive may be a curing time of about 120 seconds at a curing temperature of about 120° C.

The image sensor 50 may have a first coefficient of thermal expansion $\alpha 1$ of about 4.2 ppm/° C. and the substrate 20, which is a printed circuit board (PCB), may have a second coefficient of thermal expansion $\alpha 2$ of about 13 ppm/° C.

Figure 4A:
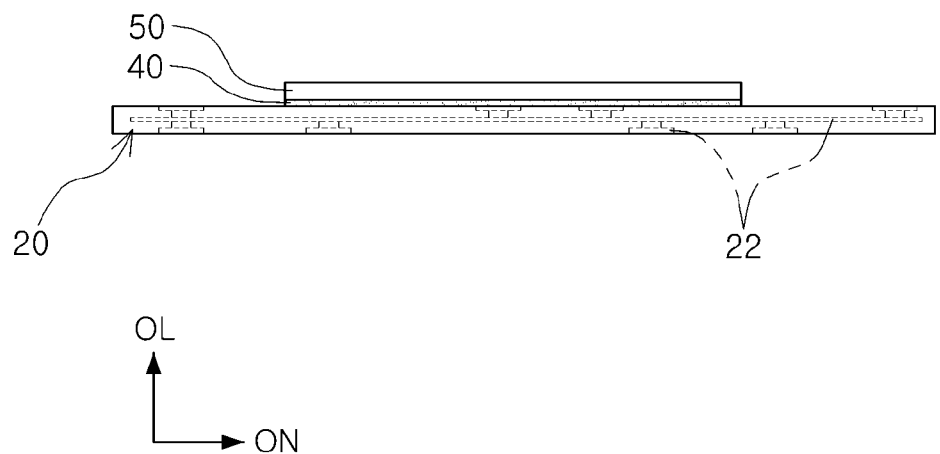
FIG. 4A is a schematic side view of the image sensor module of FIG. 2.
Figure 4B:
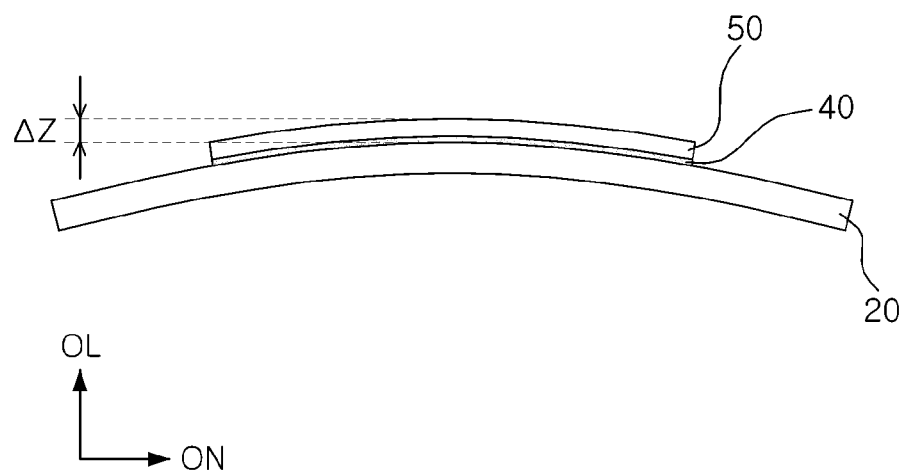
FIG. 4B is a schematic view illustrating a deformation amount ΔZ when the warpage deformation of the image sensor is generated in an optical axis.

FIG. 4A is a schematic side view of the image sensor module of FIG. 2 and FIG. 4B is a schematic view illustrating a deformation amount $\Delta Z$ when warpage deformation of the image sensor is generated in an optical axis.

Referring to FIGS. 4A and 4B, changed forms of the image sensor module before and after the curing of the adhesive are illustrated.

The second coefficient of thermal expansion $\alpha 2$ of the substrate 20 is larger than the first coefficient of thermal expansion $\alpha 1$ of the image sensor 50. Therefore, when the adhesive is cured and the temperature falls to a room temperature, the substrate 20 is contracted faster than the image sensor 50, and as illustrated in FIG. 4B, a warpage deformation phenomenon in which a central portion of the image sensor 50 becomes convex is generated. In the case in which the central portion of the image sensor becomes convex, the resolution of the lens may further be decreased at a peripheral portion of the image sensor 50.

The warpage deformation may be defined as the deformation amount $\Delta Z$ in the central portion of the image sensor 50, and the substrate having a low second coefficient of thermal expansion $\alpha 2$ may be selected to decrease the deformation amount $\Delta Z$.

For example, as illustrated in FIG. 4A, the substrate 20 may decrease the second coefficient of thermal expansion $\alpha 2$ by about 10 ppm/° C. using a copper clad laminate (CCL) 22.

In addition, the image sensor 50 may be attached to the substrate 20 by the adhesive. The adhesive may be cured to form the adhesive layer 40 between the image sensor 50 and the substrate 20.

The warpage deformation may be decreased by changing a kind of adhesive. In the case in which an adhesive having a third coefficient of thermal expansion $\alpha 3$ of 130 ppm/° C. or more at a glass transition temperature Tg or more is selected, the warpage deformation amount may be decreased.

The adhesive layer 40 may be formed to have a thickness less than that of the image sensor 50, and the adhesive may include a curable adhesive. The curable adhesive may be an epoxy-based adhesive. Since the epoxy-based adhesive has small curing contraction, it may reduce the amount of warpage.

The glass transition temperature Tg of the adhesive may be lower than a curing temperature of the adhesive. In the case in which the glass transition temperature of the adhesive is lower than the curing temperature of the adhesive, the warpage deformation amount $\Delta Z$ may be decreased.

Method of Manufacturing Image Sensor Module

Figure 5:
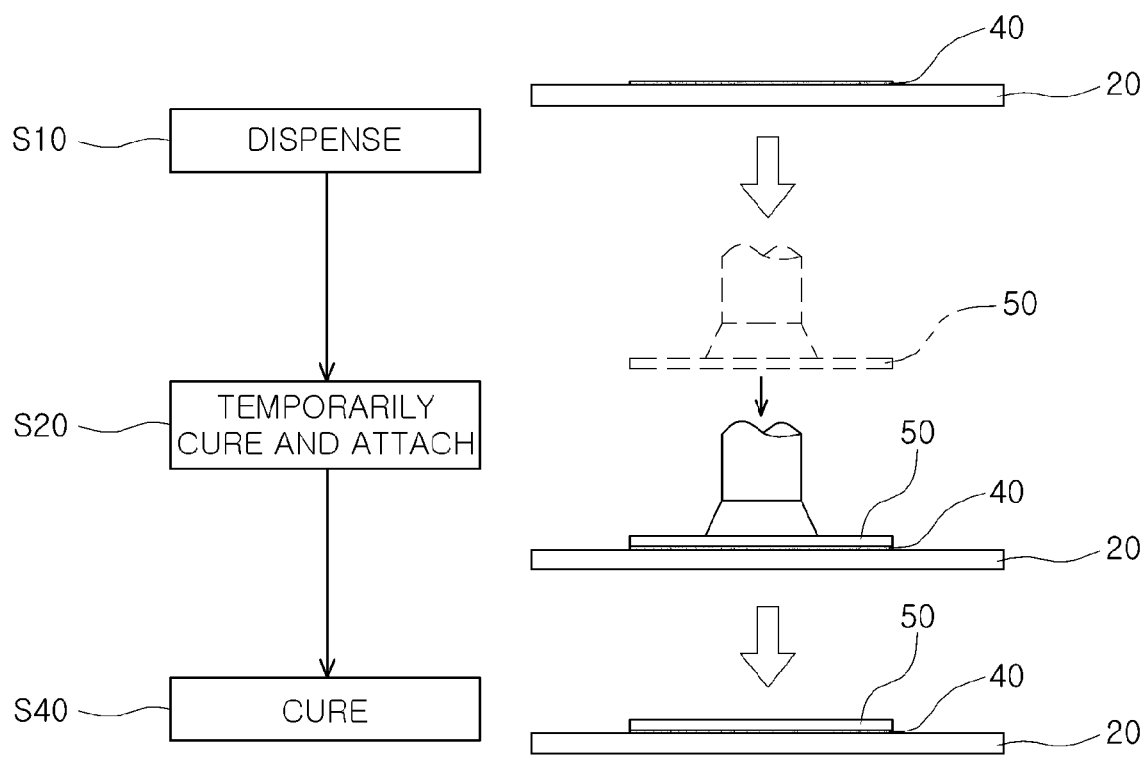
FIG. 5 is a schematic view illustrating sequential operations in a manufacturing process of an image sensor module according to an exemplary embodiment of the present disclosure.

FIG. 5 is a schematic view illustrating sequential operations in a manufacturing process of an image sensor module according to an exemplary embodiment of the present disclosure.

Referring to FIG. 5, sequential operations in a manufacturing process of an image sensor module according to an exemplary embodiment of the present disclosure may include dispensing the adhesive 40 to the substrate 20 (S10); temporarily curing and attaching the image sensor 50 to the substrate 20 onto which the adhesive 40 has been dispensed (S20); and curing the adhesive at a glass transition temperature Tg or more of the adhesive (S40).

In the dispensing operation (S10), the adhesive 40 having a third coefficient of thermal expansion α3 of 130 ppm/° C. or more at a glass transition temperature Tg or more is dispensed to the substrate 20 having a second coefficient of thermal expansion α2 and provided to have a thickness of 175 μm or less.

For example, the substrate 20, which is a printed circuit board, may have the second coefficient of thermal expansion α2 of about 13 ppm/° C. In addition, the third coefficient of thermal expansion α3 of the adhesive 40 may be about 148 ppm/° C. at the glass transition temperature of 68° C.

Here, since the first coefficient of thermal expansion α1 of the image sensor 50 is about 4.2 ppm/° C., the first coefficient of thermal expansion α1 is lower than the second coefficient of thermal expansion α2. Therefore, when the adhesive is cured and the temperature falls to a room temperature, the substrate 20 is contracted faster than the image sensor 50, such that warpage deformation may be generated.

An operation of curing the adhesive at a temperature higher than the glass transition temperature Tg in order to decrease the warpage deformation and an operation of temporarily curing the adhesive in order to further decrease the warpage deformation may be performed before the curing of the adhesive (S40).

In the temporarily curing and attaching operation (S20), the image sensor 50 may be attached to the substrate 20 by applying about 2N of pressure for 1 to 2 seconds at a temperature of 120° C. to 160° C.

After the temporarily curing and attaching operation, the adhesive may be cured at the glass transition temperature Tg or more of the adhesive.

A curing condition of the adhesive may be a curing time of about 120 seconds at a curing temperature of about 120° C.

In order to decrease the warpage deformation, a substrate having a low second coefficient of thermal expansion α2 may be selected.

For example, a copper clad laminate (CCL) 22 is used as the substrate 20 to decrease the second coefficient of thermal expansion α2 by about 10 ppm/° C. and decrease a difference between the coefficients of thermal expansion of the substrate 20 and the image sensor, such that the curing operation may be performed.

The adhesive layer 40 may be formed to have a thickness less than that of the image sensor 50, and the adhesive may include a curable adhesive. The curable adhesive may be an epoxy-based adhesive. Since the epoxy-based adhesive has small curing contraction, it may reduce the amount of warpage.

Experimental Example

Similar to a method of manufacturing an image sensor module according to an exemplary embodiment of the present disclosure, an adhesive was temporarily cured to attach an image sensor having a small thickness of 175 μm to the printed circuit board while changing a kind of adhesive, and was cured for about 120 seconds at a temperature of 120° C. (in a range of + or −5° C.) of the curing condition, the temperature fell to the room temperature, and warpage deformation of the image sensor sample in diagonal directions (directions ① and ② of FIG. 3) was then measured.

The warpage deformation in the diagonal directions was measured using a contact type measuring device (PGI850A) model manufactured by TAYLOR HOBSON. Inc.

Figure 6A:
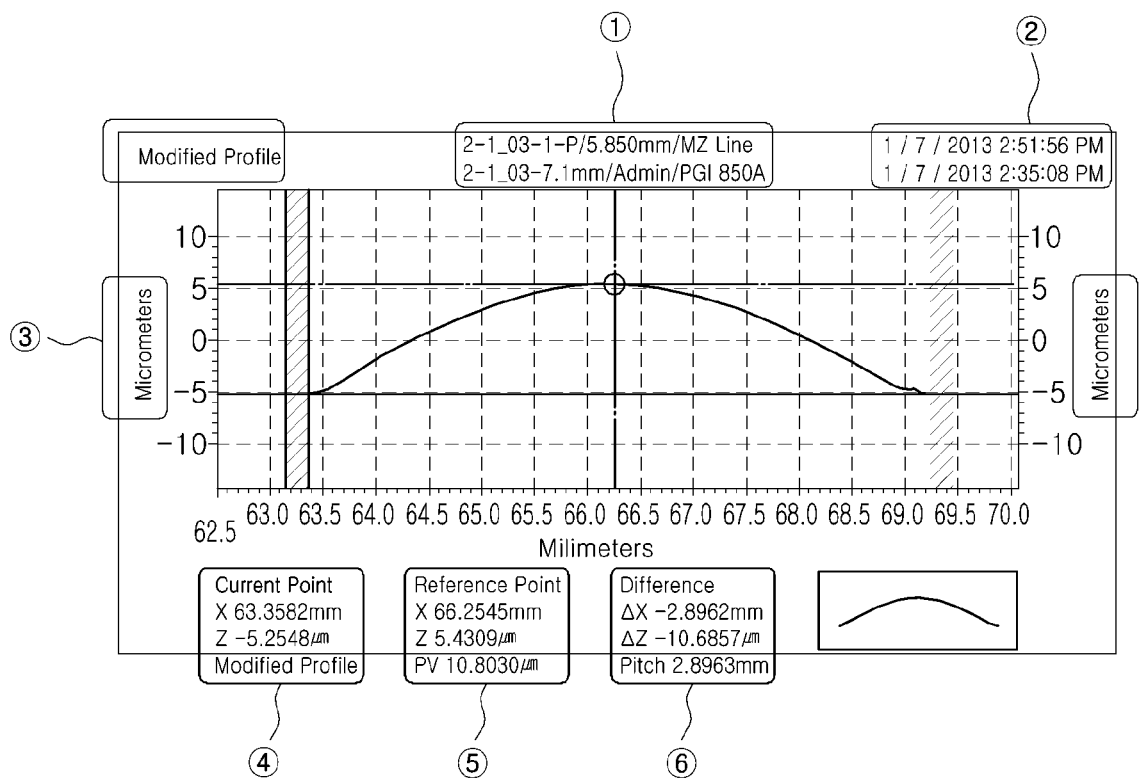
FIG. 6A illustrates a warpage deformation measurement value of an image sensor according to a comparative example measured by a contact type measuring device.
Figure 6B:
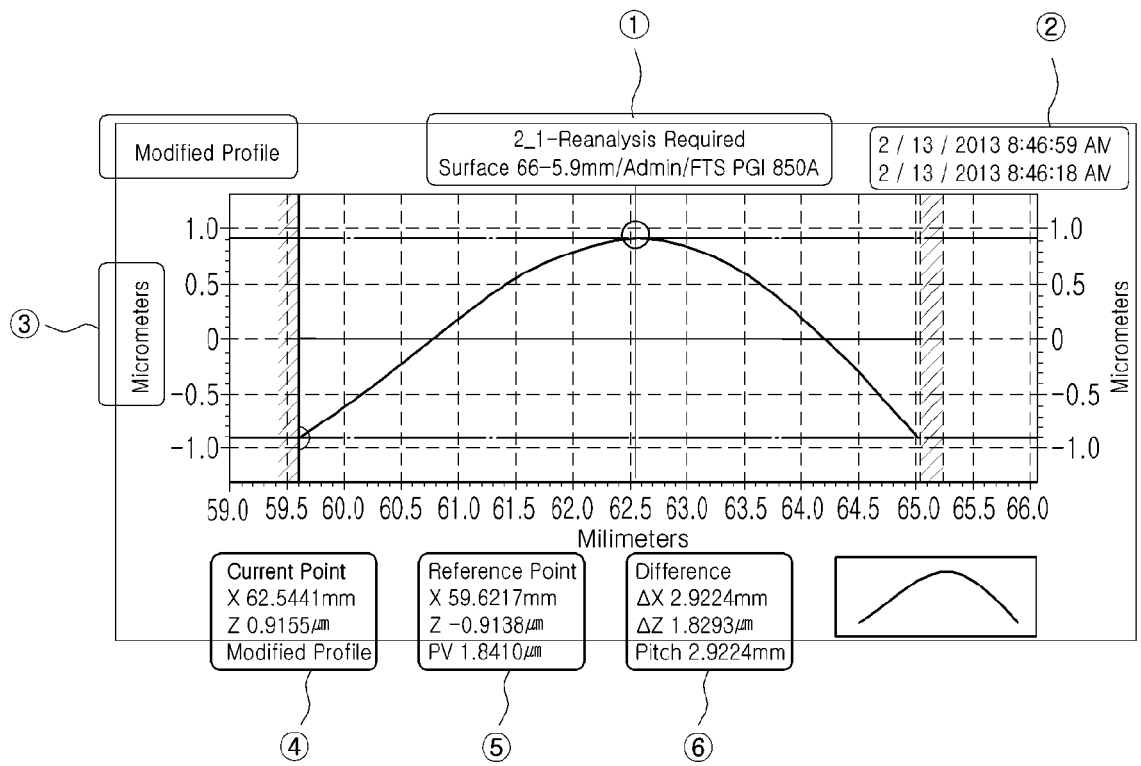
FIG. 6B illustrates a warpage deformation measurement value of an image sensor according to an exemplary embodiment of the present disclosure measured by the contact type measuring device.

FIG. 6A illustrates a warpage deformation measurement value of an image sensor according to a comparative example measured by the contact type measuring device and FIG. 6B illustrates a warpage deformation measurement value of an image sensor according to an exemplary embodiment of the present disclosure measured by the contact type measuring device.

The resultant data was obtained by measuring warpage deformations using the contact type measuring device (PGI850A) by Taylor Hobson Inc. In the case in which warpage deformations are measured by the contact type measuring device (PGI850A) by Taylor Hobson Inc., warpage deformation data of the image sensor is displayed as illustrated in FIGS. 6A and 6B.

Describing symbols illustrated in FIGS. 6A and 6B, ① represents a model and a position of the measuring device, a first line in ② represents a measuring time, and a second line in ② represents an activation starting time.

Further, ③ represents a unit of the warpage deformation, ④ represents measured values, ⑤ represents reference values at the time of measurement, and ⑥ represents practical measured values.

100 samples for each adhesive were experimented and the experimental results were illustrated as in the following Table 1.

TABLE 1

| Item | | Adhesive #1 | Adhesive #2 | Adhesive #3 |
|---|---|---|---|---|
| Coefficient of Thermal Expansion (α3) | | 54 ppm/° C. (Tg↓) 128 ppm/° C. (Tg↑) | 57 ppm/° C. (Tg↓) 153 ppm/° C. (Tg↑) | 99 ppm/° C. (Tg↓) 148 ppm/° C. (Tg↑) |
| Glass Transition Temperature (Tg) | | 120° C. | 54° C. | 68° C. |
| Warpage Deformation (μm) | Max | 13.9 | 7.6 | 8.2 |
| | Min | 9.4 | 4.1 | 1.6 |
| | AVG | 10.7 | 6.03 | 3.82 |

In the case in which the warpage deformation of about 10 μm is generated in a height direction of the image sensor as in the adhesive #1, deformation of fined pixels of the image sensor is increased. As a result, the resolution far below the required resolution of the image sensor may be caused.

Referring to Table 1, since the curing operation is performed at the temperature of 120° C., the adhesive #1 has the coefficient of thermal expansion of 54 ppm/° C. or 128 ppm/° C. at the glass transition temperature of 120° C. That is, since the coefficient of thermal expansion of the adhesive #1 is lower than 130 ppm/° C., force contracting the substrate faster than the image sensor may not be significantly offset.

In addition, as seen in the warpage deformation amount, the maximum warpage deformation amount ΔZ among the 100 samples is 13.9 μm in the height direction (see FIG. 4B), the minimum warpage deformation amount is 9.4 μm, and an average warpage deformation amount is about 10.7 μm.

The result of one sample using the adhesive #1 is illustrated in FIG. 6A. From the result values obtained by measuring the warpage deformation, it may be appreciated that ΔZ (height direction) is about 10.69 μm and the central portion of the image sensor is deformed to be upwardly convex.

The adhesives #2 and #3 have the glass transition temperatures of 54° C. and 68° C. at the curing temperature of 120° C. and the coefficients of thermal expansion of 153 ppm/° C. and 148 ppm/° C. higher than 130 ppm/° C. That is, since the coefficients of thermal expansion of the adhesives #2 and #3 are higher than 130 ppm/° C., force contracting the substrate faster than the image sensor may be significantly offset.

That is, in the case of the adhesives #2 and #3, the 100 samples have an average contractile force of 6.03 μm and 3.82 μm in the height direction and hardly suffer poor resolution.

FIG. 6B illustrates the result values obtained by measuring a diagonal warpage deformation amount of one image sensor module sample in the case of using the adhesive #3, where ΔZ (height direction) is about 1.83 μm and the central portion of the image sensor is slightly deformed to be upwardly convex, which is enough to prevent resolution deterioration.

The reason that the warpage deformation amount in the case of using the adhesive #3 is smaller than that in the case of using the adhesive #2 may be summarized as follows.

Since the adhesive #2 has the coefficient of thermal expansion of 153 ppm/° C. when the temperature falls from 120° C. to 54° C. and the coefficient of thermal expansion of 57 ppm/° C. when the temperature falls from 54° C. to 25° C., the adhesive #2 may have better effect as compared to the adhesive #3 having the coefficient of thermal expansion of 148 ppm/° C. in the temperature range from 120° C. to 68° C., but may have lesser effect as compared to the adhesive #3 having the coefficient of thermal expansion 99 ppm/° C. in the temperature range from 68° C. to 25° C. Therefore, it may be appreciated that the adhesive #3 may have better effect as compared to the adhesive #2 when the temperature falls from 120° C. to 25° C. in view of the overall effect.

As set forth above, according to exemplary embodiments of the present disclosure, since an image sensor module is attached to a substrate using an adhesive having a coefficient of thermal expansion significantly decreasing a difference in deformation rates between an image sensor and the substrate, the warpage of the image sensor may be decreased even when temperatures are changed.

Since the warpage of the image sensor is significantly reduced, the focus of a lens may focus on a central portion of the image sensor and the resolution thereof may be increased.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing an image sensor module for a subminiature camera, the method comprising:
    dispensing an adhesive having a third coefficient of thermal expansion of 130 ppm/° C. or more at a glass transition temperature Tg or more of the adhesive to a substrate having a second coefficient of thermal expansion and a thickness of 175 μm or less, the adhesive having a thickness less than that of the image sensor;
    temporarily curing and attaching an image sensor having a first coefficient of thermal expansion to the substrate to which the adhesive has been dispensed; and
    curing the adhesive at the glass transition temperature Tg or more of the adhesive, the glass transition temperature of the adhesive being lower than a curing temperature of the adhesive,
    wherein pressure is applied for 1 to 2 seconds at a temperature range of 120° C. to 160° C. in the attaching of the image sensor to the substrate, and
    the curing of the adhesive is performed for about 120 seconds at about 120° C.

2. The method of claim 1, wherein the adhesive is applied to form an adhesive layer thinner than the image sensor.

3. The method of claim 1, wherein the substrate includes a copper clad laminate (CCL).

4. The method of claim 1, wherein the adhesive includes an epoxy-based adhesive.

* * * * *